US008635512B2

(12) United States Patent
Lee et al.

(10) Patent No.: US 8,635,512 B2
(45) Date of Patent: Jan. 21, 2014

(54) MEMORY SYSTEM WITH PAGE-BASED ITERATIVE DECODING STRUCTURE AND PAGE-BASED ITERATIVE DECODING METHOD THEREOF

(75) Inventors: Kijun Lee, Seoul (KR); Hong Rak Son, Anyang-si (KR); Junjin Kong, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 301 days.

(21) Appl. No.: 13/110,395

(22) Filed: May 18, 2011

(65) Prior Publication Data

US 2011/0289384 A1 Nov. 24, 2011

(30) Foreign Application Priority Data

May 18, 2010 (KR) .................. 10-2010-0046596

(51) Int. Cl.
*H03M 13/00* (2006.01)
*G06F 11/00* (2006.01)
*G08C 25/00* (2006.01)
*G11B 27/00* (2006.01)

(52) U.S. Cl.
USPC ............ 714/774; 714/752; 714/814; 714/799

(58) Field of Classification Search
USPC ......... 714/763, 764, 767, 774, 780, 799, 800, 714/805, 807, 746, 752, 758, 52, 814, 815
See application file for complete search history.

(56) References Cited

U.S. PATENT DOCUMENTS

| | | | |
|---|---|---|---|
| 6,858,906 B2 | 2/2005 | Lee et al. | |
| 7,529,124 B2 | 5/2009 | Cho et al. | |
| 7,533,328 B2 | 5/2009 | Alrod et al. | |
| 7,577,891 B2 * | 8/2009 | Farjadrad et al. | 714/752 |
| 7,623,366 B2 | 11/2009 | Park et al. | |
| 8,341,502 B2 * | 12/2012 | Steiner et al. | 714/774 |
| 8,433,970 B2 * | 4/2013 | Rault et al. | 714/752 |
| 2004/0169238 A1 | 9/2004 | Lee et al. | |
| 2006/0180851 A1 | 8/2006 | Lee et al. | |
| 2006/0193404 A1 | 8/2006 | Zakharchenko et al. | |
| 2008/0320366 A1 | 12/2008 | Lin | |
| 2009/0106626 A1 | 4/2009 | Hou et al. | |

FOREIGN PATENT DOCUMENTS

KR  10-0673020 B1  1/2007

* cited by examiner

*Primary Examiner* — Christine Tu
(74) *Attorney, Agent, or Firm* — Lee & Morse, P.C.

(57) ABSTRACT

A method of iteratively decoding data transferred through a channel is provided. The method may include iteratively decoding each sector of 1 to N sectors of the data in continuous succession until all N sectors are decoded, wherein upon determination of successful completion of iterative decoding corresponding to a current sector of the N sectors, immediately initiating iterative decoding a next sector of the N sectors.

16 Claims, 6 Drawing Sheets

MEMORY SYSTEM WITH PAGE-BASED ITERATIVE DECODING STRUCTURE AND PAGE-BASED ITERATIVE DECODING METHOD THEREOF

CROSS-REFERENCE TO RELATED APPLICATIONS

This application claims priority under 35 U.S.C. §119 to Korean Patent Application No. 10-2010-0046596, filed on May 18, 2010, in the Korean Intellectual Property Office, and entitled: "Memory System with Page-Based Iterative Decoding Structure and Page-Based Iterative Decoding Method Thereof," which is incorporated by reference herein in its entirety.

BACKGROUND

1. Field

Exemplary embodiments relate to electronic devices, and more particularly, to memory systems.

2. Description of the Related Art

When digital information is transferred, recorded or reproduced, errors can occur in portions of the digital information due to, e.g., the effects of alpha rays or other cosmic rays, defects or noise in the transmission channel, etc. There are known technologies that employ error detecting code or error correction code in order to detect such errors and correct detected errors. In principle, there is no difference between error detecting codes and error correction codes, and they may be referred to collectively as error control codes. Similarly, the use of error detection and error correction may be referred to collectively as error control.

In transferring or recording digital information using error control codes, for example, m-bit error control information (redundant bits) may be appended to k-bit digital information (information bits) to generate a (k+m)-bit codeword. The (k+m) bit codeword is then transmitted across a communication channel. At the transfer destination of the codeword (i.e. the receiver), error detection or error correction is performed using the redundant bits contained in the codeword. The process of generating the codeword is termed "encoding", while the process of error detection and/or error correction based on the codeword is termed "decoding."

With a view to further improving reliability during transmission or recording of digital information, it may be desirable to employ error control codes having high error correction/error detection capability. However, when codes with high error correction/error detection capability are used, the bit length of the redundant bits tends to be longer, and the efficiency of information transmission tends to decline.

SUMMARY

One or more embodiments may provide a method of iteratively decoding data transferred through a channel, the method including (a) iteratively decoding one of N sectors of the data, (b) determining whether iterative decoding of a current sector of the N sectors of the data has successfully completed, (c) upon determination of successful completion of the iterative decoding of the current sectors of the N sectors, immediately initiating iterative decoding a next sector of the N sectors of the data, and repeating (b) and (c) until all of the N sectors are decoded.

Immediately initiating iterative decoding of a next sector may include immediately performing iterative decoding of the next sector, without an idle state, following iterative decoding of a previous sector.

Decoding of each sector may be iteratively performed within a default decoding time.

When decoding of a current sector of the N sectors is terminated earlier than the default decoding time allocated thereto, the method may include increasing a default decoding time of a next sector of the N sectors to be processed by a remaining time of the default decoding time allocated to the current sector one of the N sectors.

The channel may include a memory, the data being read out from the memory by a page unit.

The default decoding time may be set to a time of (Tdw+ (Tdw−Tda)), where Tdw and Tda respectively correspond to a worst decoding time and an average decoding time obtained by testing decoding times of sectors read from the memory.

An iterative decoding time of each sector in the data may be maintained constant.

Decoding of each sector may be performed iteratively within a default decoding time, and a time taken to decode a current sector being used as a default decoding time of a next sector.

One or more embodiments may provide a data storage system, including a memory, and a controller including a buffer memory for storing data read from the memory and an ECC encoding and decoding block for decoding data read from the memory, wherein the ECC encoding and decoding block is configured to iteratively decode each of sectors in the data, and to increase a default decoding time of a next sector to be processed by any remaining time of a current sector when decoding of the current sector is terminated before than the default decoding time.

Data to be stored in the buffer memory may be read out from the memory by a page unit.

A time taken to decode data read by the page unit may be fixed.

The default decoding time may be set to a time of (Tdw+ (Tdw−Tda)), where Tdw and Tda respectively correspond to a worst decoding time and an average decoding time obtained by testing decoding times of sectors read from the memory.

An iterative decoding time of each sector in the data may be maintained constant.

The ECC encoding and decoding block has no idle state during a decoding operation data read from the memory.

One or more embodiments may provide a page-based iterative decoding method of a data storage system including a memory, including reading data including N sectors from the memory, sequentially decoding the N sectors of the read data during a page-based decoding time, and, when decoding of the N sectors of the read data is completed successfully, sending error-corrected data with respect to data read from the memory, to an external device, wherein a default decoding time of a next sector is increased by any remaining time of a current sector when decoding of the current sector is terminated before than the default decoding time.

A sum of decoding times of the N sectors in the read data may be set to a time longer than the page-based decoding time.

Sequentially decoding may include iteratively decoding each sector of the 1 to N sectors of the data in continuous succession until all N sectors are decoded, wherein, immediately upon determination of successful completion of iterative decoding of a current sector of data, immediately initiating iterative decoding a next sector.

Decoding of each of the N sectors may be made iteratively within a respective default decoding time associated with the respective sector.

Decoding of each sector may be made iteratively within a default decoding time, a time taken to decode a current sector is used as a default decoding time of a next sector.

One or more embodiments may provide a method of iteratively decoding data transferred through a channel, the method including iteratively decoding each sector of 1 to N sectors of the data in continuous succession until all N sectors are decoded, wherein upon determination of successful completion of iterative decoding corresponding to a current sector of the N sectors, immediately initiating iterative decoding a next sector of the N sectors.

Each of the N sectors may be associated with a respective default decoding time, and immediately decoding a next sector of the N sectors includes transferring any time remaining in the respective default time of the current sector to the respective default decoding time of the next sector such that there is no idle time between completion of iterative decoding of the current sector and start of iterative decoding of the next sector.

BRIEF DESCRIPTION OF THE DRAWINGS

One or more features will become more apparent to those of ordinary skill in the art by describing in detail exemplary embodiments with reference to the attached drawings, in which.

DETAILED DESCRIPTION

Exemplary embodiments will be described more fully hereinafter with reference to the accompanying drawings, in which embodiments of the inventive concept are shown. Features may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of elements may be exaggerated for clarity. Like numbers refer to like elements throughout the specification.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element is referred to as being, e.g., "connected to", "coupled to", or "adjacent to" another element it can be directly on, connected, coupled, or adjacent to the other element or layer, or intervening elements may be present. In contrast, when an element is referred to as being "directly on," "directly connected to", "directly coupled to", or "immediately adjacent to" another element, there are no intervening elements present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 1:
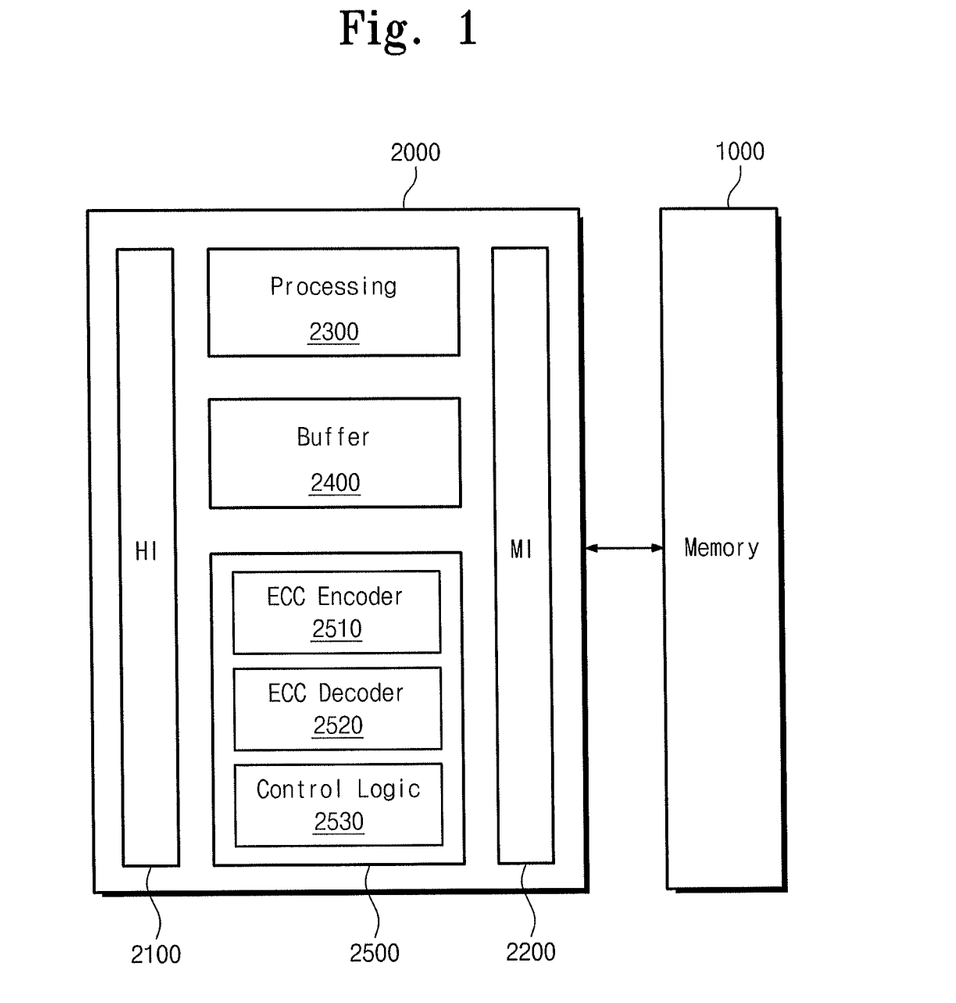
FIG. 1 illustrates a block diagram of an exemplary embodiment of a memory system.

FIG. 1 illustrates a block diagram of an exemplary embodiment of a memory system.

Referring to FIG. 1, a memory system may include a memory 1000 and a controller 2000. The memory 1000 may operate responsive to the control of the controller 2000 and may be used to store data. The memory 1000 may include a flash memory, DRAM, PRAM, FRAM, MRAM, etc. The memory 1000 may be used as a channel that receives data from the controller 2000 and transfers the received data to the controller 2000. Although not shown in FIG. 1, the memory 1000 may include storage elements, each of which may store single-bit data or multi-bit/multi-level data. Storage elements of the memory 1000 may be arranged in a two-dimensional array structure or a three-dimensional array structure. The above-mentioned memory 1000 is not limited to a semiconductor memory. For example, the memory 1000 may include an optical disk, a magnetic disk, and the like. A channel using the memory 1000 may include a wireless channel, a wire channel, and a combination including a wireless channel and a wire channel.

Referring still to FIG. 1, the controller 2000 may operate responsive to a request of an external device, e.g., a host, and may be configured to store data in the memory 1000 or to read data from the memory 1000 in response to a request of the external device. The controller 2000 may include a host interface 2100, a memory interface 2200, a processing unit 2300, a buffer memory 2400, and an ECC encoding and decoding block 2500. Although not shown in FIG. 1, it is comprehended that the controller 2000 may include, e.g., an encipher/decipher block, ROM, a bus arbiter, and the like.

The host interface 2100 may be configured to interface with an external device (for example, a host). For example, the host interface 2100 may be connected with the external device through standardized interfaces, a NOR interface, a wireless/RF interface, or a combination of wireless and wire interfaces. The standardized interfaces may include AT Attachment(ATA), Serial ATA(SATA), Parallel ATA(PATA), Universal Serial Bus(USB), Small Computer System Interface(SCSI), Enhanced Small Disk Interface(ESDI), and Integrated Drive Electronics(IDE) interface. The memory interface 2200 may be configured to interface with the memory 1000. Herein, it is comprehended that the host and memory interfaces 2100 and 2200 may be changed variously depending upon the memory 1000 used as a channel and the external device (for example, a host). The processing unit 2300 may control an operation of the controller 2300 overall. The buffer memory 2400 may be used to temporarily store data to be sent to the memory 1000 from an external device. The ECC encoding and decoding block 2500 may be configured to encode data to be stored in the memory 1000 and to decode data read out from the memory 1000.

As illustrated in FIG. 1, the ECC encoding and decoding block 2500 may include an ECC encoder 2510, an ECC decoder 2520, and control logic 2530. The ECC encoder 2510 may be configured to encode data to be sent to the memory 1000 in response to the control of the control logic 2530. The ECC decoder 2520 may be configured to decode data sent from the memory 1000 in response to the control of the control logic 2530. The ECC encoding and decoding block 2500 may be configured to decode data sent from the memory 1000, depending upon the iterative decoding manner. In particular, the ECC encoding and decoding block 2500 may be configured to variably control a decoding time (or, the number of iterative decoding operations) of a sector being the iterative decoding unit, which will be more fully described below. It is possible to reduce and/or eliminate an idle time of the ECC decoder 2520 by variably controlling the decoding time (or, the number of iterative decoding operations) of a sector and to improve a bit error rate BER without deterioration of throughput of the ECC decoder 2520.

Figure 2:
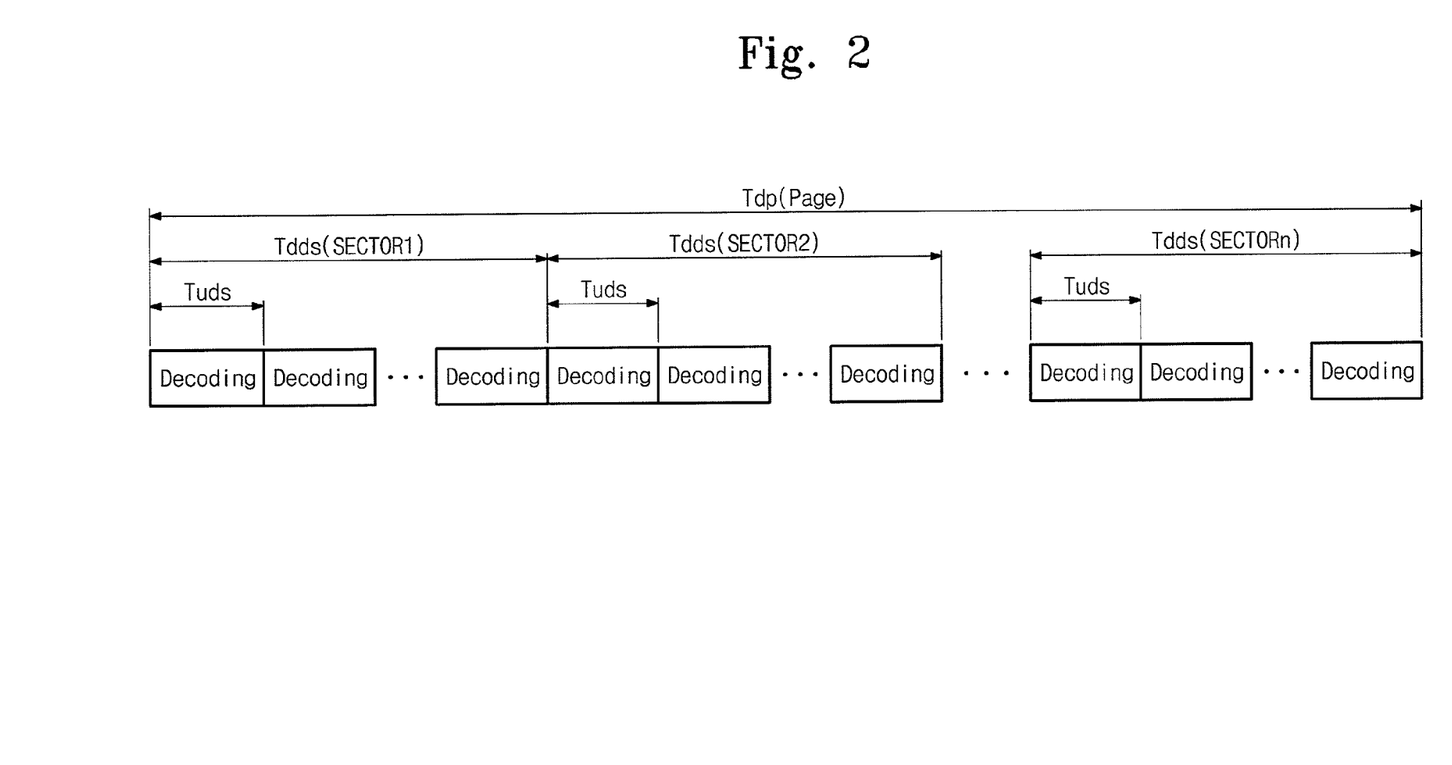
FIG. 2 illustrates a schematic diagram for describing an exemplary iterative decoding operation of an exemplary embodiment of the ECC encoding and decoding block of FIG. 1.

FIG. 2 illustrates a schematic diagram for describing an exemplary iterative decoding operation of an exemplary embodiment of the ECC encoding and decoding block 2500 of FIG. 1.

Referring to FIGS. 1 and 2, the memory 1000 may, e.g., be used as a channel and may include a NAND flash memory, and the memory 1000 may perform a program operation by a page unit. As well known, a page may include a plurality, e.g., N sectors, where N may be an integer equal to or greater than 2. When data is transferred to the memory 1000 from a controller 2000, the ECC encoder 2510 may generate parity information (or, called ECC parity data) for error detection and correction of each of the sectors corresponding to a respective page. More particularly, error detection and correction may be made by a sector unit. With the iterative decoding manner, decoding of each sector read from the memory 1000 may be made iteratively.

For example, referring to FIG. 2, decoding of a sector may be repeated within a default decoding time Tdds of that sector. Decoding of a sector may be made once within a unit decoding time Tuds. A time taken to decode a sector and more particularly, e.g., a decoding time Tdp of a page, may be previously determined based on, e.g., a device employing a memory system including one or more features described herein. More particularly, e.g., a respective decoding time Tdp of a page may be based on an operating frequency of the device being employed.

Although the default sector decoding time Tdds may be determined and set previously, in one or more embodiments, the memory system may be configured to vary respective decoding times Tdds of the sectors in a page within a time Tdp taken to decode a page. More particularly, e.g., in one or more embodiments, although a default decoding time Tdds of each sector may be previously set, the ECC encoding and decoding block 2500 may adjust, e.g., increase/decrease, the default decoding time Tdds of a sector to be processed next, depending upon an actual decoding time of a sector currently being processed. For example, when an actual decoding time of a sector currently being processed is shorter than the preset sector default decoding time Tdds, the ECC encoding and decoding block 2500 may increase a default decoding time Tdds of a sector to be processed next by, e.g., Td–Ta, where Td may correspond to a preset default decoding time and Ta may correspond to an actual decoding time of the previous sector. In such embodiments, decoding for a sector to be processed next may be at least initiated during a remaining time, e.g., Td–Ta, of the preset default decoding time associated with the previous sector.

More particularly, e.g., when an actual decoding time of a sector currently being processed is shorter than the preset default decoding time Tdds, a remaining decoding time of the ECC decoder 2520 for the currently selected sector may be used to decode a subsequent sector, e.g., a sector to be selected next, rather than simply being treated as an idle time. In one or more embodiments, an idle state of the ECC decoder 2520 may be reduced and/or eliminated as a result of, e.g., efficient sector decoding such that decoding of another sector yet to be decoded may be initiated and possibly even completed using the remaining decoding time of one or more of the already decoded sectors, e.g., the previously decoded sectors of the page. That is, while a preset or even adjusted decoding time may be associated with each of the sectors as a general guideline, decoding of sectors associated with a page that are yet to be decoded may respectively occur in series upon successful decoding of the previous sector of the page until all the sectors associated with the page are successfully decoded such that no idle time may exist therebetween. The above-described iterative decoding operation may be made on the basis of a time Tdp necessary for decoding a page. In one or more embodiments, although the decoding time Tdp of a page may be fixed, a time Tdds for decoding each sector may be variably controlled so as to reduce and/or eliminate an idle state. In one or more embodiments, no idle time may exist between decoding of each of the sectors associated with a page.

In an exemplary embodiment, a test process may be employed to measure decoding times for decoding sectors in at least one page read from the memory 1000. Based on such a measurement, it is possible to obtain an average decoding time Tda and a worst decoding time Tdw. When the sector-per-page number is N and a default decoding time of a single sector is Tdds, a maximum decoding time of a single page may be (N*Tdds). It is understood, the worst decoding time Tdw may vary based on test circumstances, testing method, etc.

In general, a default decoding time of each sector may be set to the worst decoding time Tdw. In one or more embodiments, a memory system may set a default decoding time Tdds of each sector to ((Tdw–Tda)+Tdw). In one or more embodiments, a sum of default decoding times Tdds of sectors may be set to be longer than a time Tdp taken to decode a page. In one or more embodiments, by removing an idle time of, e.g., the EDD decoder 2520 as described above, an iterative decoding operation may be completed within a time Tdp taken to decode a page even though a sum of default decoding times Tdds of sectors may be set to be longer than a time Tdp taken to decode a page, In one or more other embodiments, a default decoding time of each sector may not be preset. In such embodiments, an actual decoding time of a currently processed sector may be used as a default decoding time of a sector to be processed next. In other such embodiments, decoding times taken for decoding a plurality of sectors may be measured in real time and an average of the measured times may be used as a default decoding time of sectors yet to be processed according to the iterative decoding operation.

In one or more embodiments, a remaining time after decoding of a currently processed sector may be applied to a decoding operation of a sector yet to be processed, e.g., a sector next in line to be decoded, regardless of a manner that is used to set a default decoding time. As a result, an actual time necessary for decoding each sector, as described above, may be determined variably such that no idle time of the ECC decoder 2510 may exist.

Figure 3:
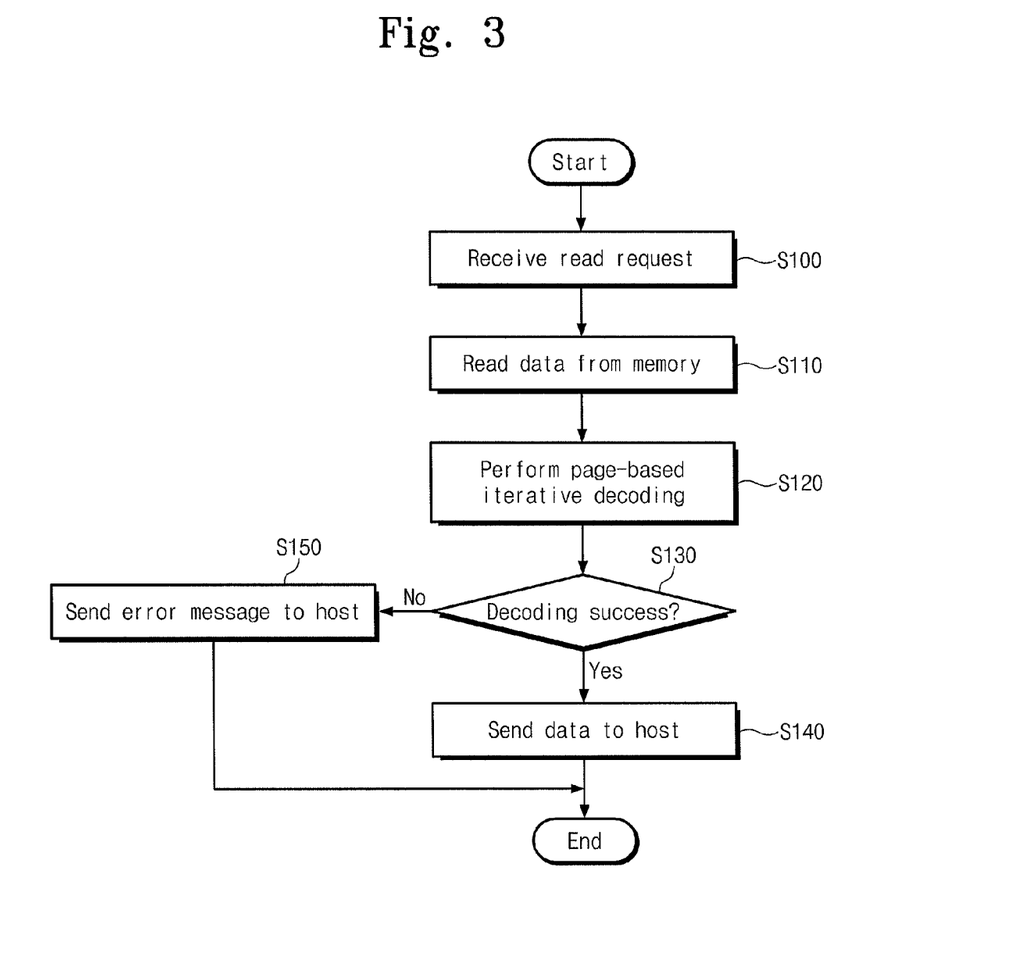
FIG. 3 illustrates a flow chart of an exemplary embodiment of a read operation of an exemplary embodiment of a memory system.

FIG. 3 illustrates a flow chart of an exemplary embodiment of a read operation of an exemplary embodiment of a memory system.

Referring to FIG. 3, when a read request is received from an external device, e.g., a host, (S100), a controller 2000 may read data from a memory 1000 (S110). The read data may be temporarily stored in a buffer memory 2400 illustrated in FIG. 1. Data stored in the buffer memory 2400, e.g., may include at least one page including a plurality of sectors. An ECC encoding and decoding block 2500 may then perform a page-based iterative decoding operation in accordance with the processing unit 2300 (S120). This will be more fully described with reference to FIG. 4. Referring to FIG. 3, the control logic 2530 may then judge whether the decoding operation is completed successfully (S130). If the decoding operation is completed successfully (S130=Yes), read-requested data may be transferred to the external device in accordance with the processing unit 2300 (S140). If the decoding operation is not completed successfully (S130=No), an error message may be sent to the external device in accordance with the processing unit 2300.

Figure 4:
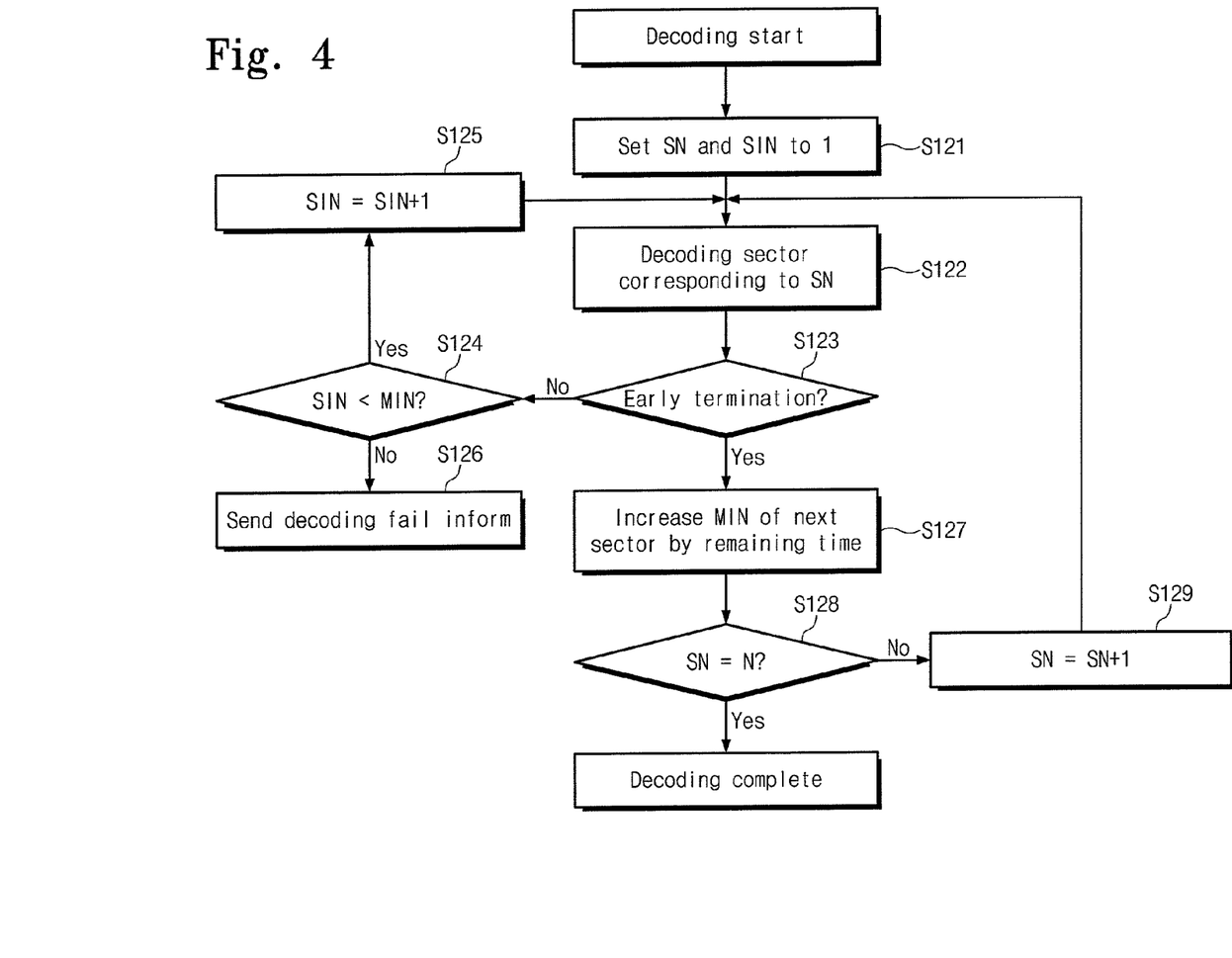
FIG. 4 illustrates a flow chart for describing a page-based iterative decoding operation mentioned in FIG. 3.
Figure 5:
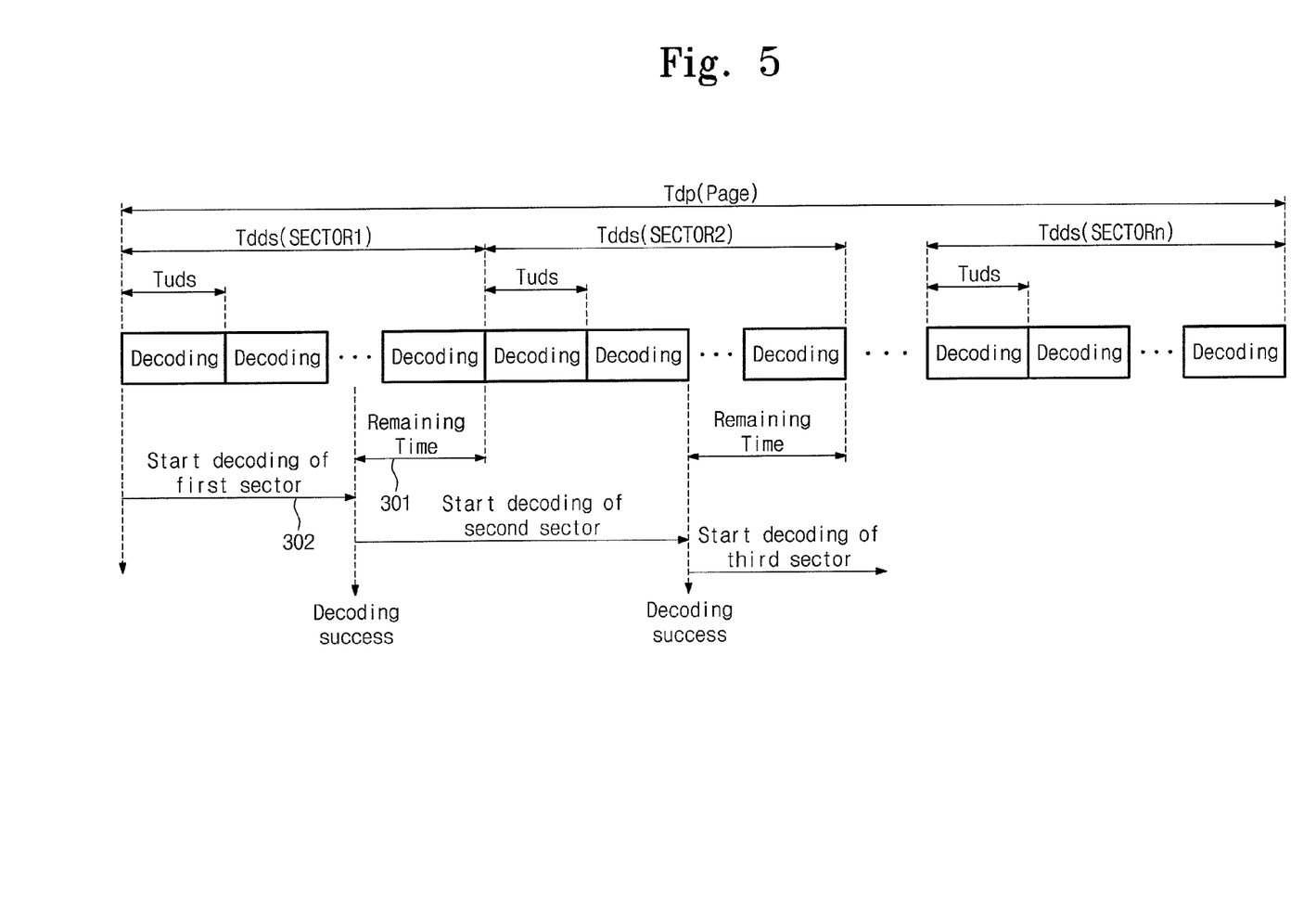
FIG. 5 illustrates a diagram for describing a decoding time of each sector which varies when a page-based iterative decoding operation is executed.

FIG. 4 illustrates a flow chart of an exemplary embodiment of a page-based iterative decoding operation (S120 of FIG. 3). FIG. 5 illustrates a schematic diagram of a decoding time of each exemplary sector, including variations thereof, when a page-based iterative decoding operation employing one or more features described herein is executed. Below, an exemplary embodiment of a page-based iterative decoding operation will be described with reference to accompanying drawings. For ease of description, a page-based iterative decoding operation will be described under the assumption that a page includes N sectors and that a default decoding time Tdds is set to the above-described time of (Tdw+(Tdw−Tda)).

Once a page-based decoding operation commences (S121), variables SN and SIN may be set, e.g., to '1'. Herein, the variable SN is used to indicate the number of a sector in a page, and the variable SIN is used to indicate an iterative decoding number of a sector. The ECC decoder 2520 may perform a decoding operation with respect to a sector, e.g., the first sector corresponding to the variable SN, in accordance with the control logic 2530 (S122). The decoding operation may be performed during a unit decoding time Tuds. The control logic 2530 may judge whether the sector decoding operation is terminated early (S123).

More particularly, the sector decoding operation may be considered to be terminated early when the decoding of the sector SN is performed successfully within a time shorter than the default decoding time Tdds.

If the sector decoding operation is judged not to be terminated early (S123=No), additional information may be determined. For example, if the sector decoding operation is determined not to be terminated early, the control logic 2530 may determine whether an iterative decoding number SIN is less than the maximum iterative decoding number MIN (=Tdds/Tuds). If the iterative decoding number SIN is less than the maximum iterative decoding number MIN (S124=Yes) a value of the variable SIN may be increased by 1 (S125). Afterwards, the sector corresponding to the respective variable SN currently being processed may be decoded (S122).

If the iterative decoding number SIN is more than the maximum iterative decoding number MIN (S124=No), fail information of the decoding operation may be provided to the processing unit 2300 (S126). The failure of the decoding operation may be processed by various methods. For example, it is possible to inform an external device that a read operation has failed. Alternatively, e.g., a read operation of the memory 1000 may be performed again with read voltages adjusted.

If the sector decoding operation is judged to be terminated early (S123=Yes), the control logic 2530 may increase the maximum iterative decoding number MIN (or, a default decoding time) of a sector to be processed next, by a decoding number (or, a decoding time) corresponding to the remaining time 301 (refer to FIG. 5) generated by early termination (S127). Although the maximum iterative decoding number may be preset, the maximum iterative decoding number of each sector may be varied according to whether a decoding operation of a previously processed sector is terminated early. Accordingly, in one or more embodiments, the ECC decoder 2520 may not remain in an idle state during the remaining time 301 (refer to FIG. 5). More particularly, when a decoding operation of the first sector is terminated early (i.e., decoding success of the first sector, as illustrated in FIG. 5), a time 302 taken to perform a decoding operation of the first sector was shorter than a default decoding time Tdds of the first sector and the remaining time 301 may be employed to start decoding of the next sector, e.g., the second sector.

Referring to FIG. 4, when the sector decoding operation is judged to be terminated early (S123=Yes) and/or the maximum iterative decoding number MIN (or, a default decoding time) of a sector to be processed next is increased (S127), the control logic 2530 may judge whether all N sectors associated with a page are decoded. If all N sectors are decoded (S128=No), the variable SN may be increased by 1 such that a next sector may be selected (S129) and the sector corresponding to the respective variable SN currently being processed may be decoded (S122).

In one or more embodiments, cases may arise in which a time taken to perform a sector decoding operation exceeds a default decoding time. In such cases, it is possible to complete the sector decoding operation by applying a time remaining when a decoding operation of one or more previously processed sectors, e.g., decoding operation of a currently processed sector, is terminated early, to a decoding operation of a sector to be processed next.

In one or more embodiments, a sector to be decoded next may be sent to the buffer memory 2400 from the memory 1000 during a decoding operation of a currently selected sector.

In one or more embodiments, a non-volatile memory device that retains data even when powered-off may be employed. With increase in mobile devices such as cellular phones, PDA digital cameras, portable gate consoles, and MP3s, a flash memory device may be employed for data storage and/or code storage. Flash memory devices may be employed in other devices, e.g., home devices such as HDTV, DVD, router, and GSP.

Figure 6:
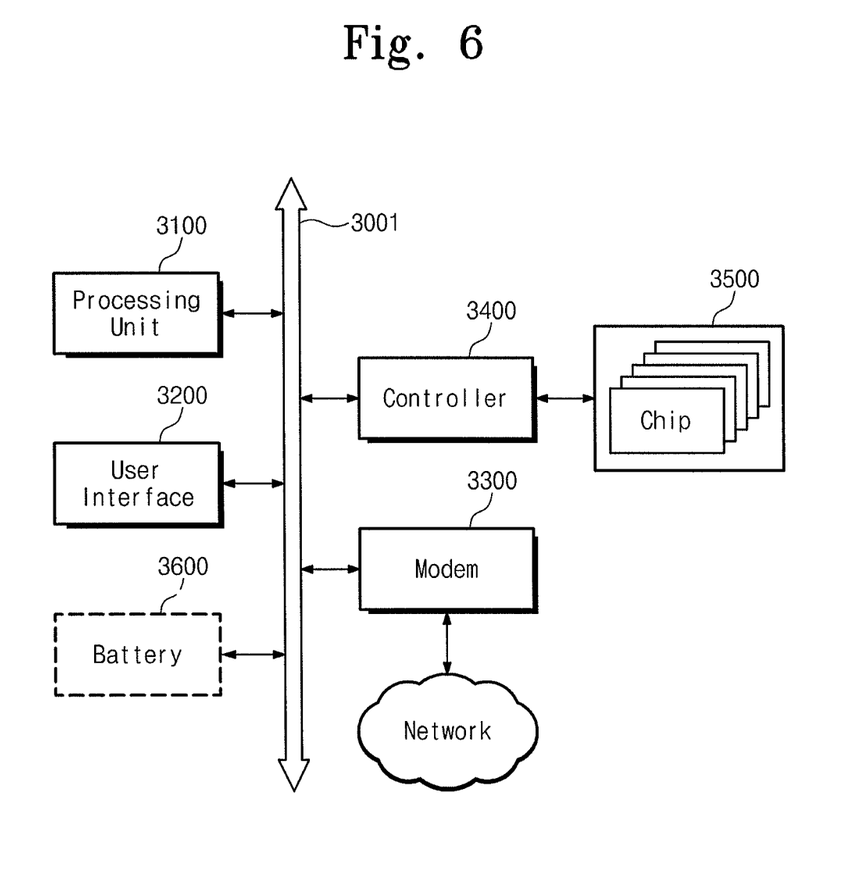
FIG. 6 illustrates a block diagram of a computing system including an exemplary embodiment of a memory system.

FIG. 6 illustrates a block diagram of an exemplary embodiment of a computing system including a memory system employing one or more features described herein.

Referring to FIG. 6, a computing system may include a processing unit, e.g., a CPU, 3100, a user interface 3200, a modem 3300, e.g., a baseband chipset, a memory controller 3400, and a non-volatile memory device 3500 as a storage media. The non-volatile memory device 3500 may be configured substantially identically with that illustrated and/or described with regard to FIG. 1, and description thereof is thus omitted.

Referring to FIG. 6, the non-volatile memory 3500 may include a plurality of memory chips. N-bit data (N being any integer greater than or equal to 1) processed/to be processed by the processing unit 3100 may be stored in the non-volatile memory device 3500 through the memory controller 3400. In embodiments in which the computing system is a mobile device, a battery 3600 may be included in the computing system to supply an operating voltage thereto. Although not illustrated in FIG. 6, the computing system may include, e.g., an application chipset, a camera image processor (CIS), a mobile DRAM, and the like. The memory controller 3400 and the non-volatile memory device 3500 may correspond to a Solid State Drive (SSD) that employs, e.g., a non-volatile memory to store data. Alternatively, e.g., the memory controller 3400 and the non-volatile memory 3500 may correspond to a memory card.

In one or more embodiments, memory cells may include a variable resistance memory cell. An exemplary variable resistance memory cell and a memory device including the same are disclosed in U.S. Pat. No. 7,529,124, the entirety of which is incorporated by reference herein.

In one or more other embodiments, memory cells may include one of various cell structures having a charge storage layer. Cell structures having a charge storage layer may include a charge trap flash structure using a charge trap layer, a stack flash structure in which arrays are stacked in a multiple layer, a source-drain free flash structure, a pin-type flash structure, etc.

A memory device having a charge trap flash structure as a charge storage layer is disclosed in U.S. Pat. No. 6,858,906 and U.S. Publication Nos. 2004/0169238 and 2006/0180851, the entireties of which are incorporated by reference herein. A source-drain free flash structure is disclosed in KR Patent No. 673020, the entirety of which is incorporated by reference herein.

A non-volatile memory device and/or a memory controller according to the inventive concept may be packed using various types of packages. For example, a non-volatile memory device or a memory controller according to the inventive concept may be packed using packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A method of iteratively decoding data transferred through a channel, the method comprising:
   (a) iteratively decoding one of N sectors of the data;
   (b) determining whether iterative decoding of a current sector of the N sectors of the data has successfully completed before a predetermined decoding time;
   (c) upon determination of successful completion of the iterative decoding of the current sector of the N sectors before the predetermined decoding time, increasing a maximum decoding time for a next sector of the N sectors of the data to be iteratively decoded; and
   (d) initiating iterative decoding the next sector of the N sectors of the data; and repeating (b)-(d) until all of the N sectors are decoded.

2. The method as claimed in claim 1, wherein initiating iterative decoding of a next sector in (d) includes immediately performing iterative decoding of the next sector, without an idle state, following iterative decoding of the current sector.

3. The method as claimed in claim 1, wherein, when decoding of a current sector of the N sectors is terminated earlier than the predetermined decoding time allocated thereto, the maximum decoding time of the next sector of the N sectors to be processed is increased by a time difference between the predetermined decoding time allocated to the current sector of the N sectors and an actual decoding time of the current sector.

4. The method as claimed in claim 3, wherein the channel is coupled to a memory, the data being read out from the memory by a page unit.

5. The method as claimed in claim 4, wherein the default decoding time is set to a time of (Tdw+(Tdw−Tda)), where Tdw and Tda respectively correspond to a worst decoding time and an average decoding time obtained by testing decoding times of sectors read from the memory.

6. The method as claimed in claim 1, wherein the predetermined decoding time is maintained constant for each of the N sectors in the data.

7. The method as claimed in claim 4, wherein decoding of each sector is performed iteratively within a default decoding time, and a time taken to decode a current sector being used as a default decoding time of a next sector.

8. A data storage system, comprising:
   a memory; and
   a controller including a buffer for storing data read from the memory and an ECC encoding and decoding block for decoding data read from the memory,
   wherein the ECC encoding and decoding block is configured to iteratively decode each of sectors in the data, and to increase a default decoding time of a next sector to be processed by a remaining time of a current sector when decoding of the current sector is terminated before the default decoding time of the current sector, wherein the default decoding time of the next sector is set to a time of (Tdw+Tdw−Tda)), where Tdw and Tda respectively correspond to a worst decoding time and an average decoding time obtained by testing decoding times of sectors read from the memory.

9. The data storage system as claimed in claim 8, wherein data to be stored in the buffer memory is read out from the memory by a page unit.

10. The data storage system as claimed in claim 9, wherein time taken to decode data read by the page unit is fixed.

11. The data storage system as claimed in claim 8, wherein the ECC encoding and decoding block has no idle state during a decoding operation data read from the memory.

12. A page-based iterative decoding method of a data storage system including a memory, comprising:
reading data including N sectors from the memory;
sequentially decoding the N sectors of the read data during a page-based decoding time; and
when decoding of the N sectors of the read data is completed successfully, sending decoded data to an external device, wherein the method further comprises increasing a default decoding time of a next sector when decoding of the current sector is terminated before than the default decoding time of the current sector, wherein:
sequentially decoding includes iteratively decoding each sector of the 1 to N sectors of the data in continuous succession until all N sectors are decoded,
upon determination of successful completion of iterative decoding of the current sector, immediately initiating iterative decoding the next sector, and
a time taken to decode the current sector is used as a basis for increasing the default decoding time of the next sector.

13. The page-based iterative decoding method as claimed in claim 12, wherein a sum of decoding times of the N sectors in the read data is set to a time longer than the page-based decoding time.

14. The page-based iterative decoding method as claimed in claim 12, wherein decoding of each sector of the N sectors is made iteratively within a respective default decoding time associated with the respective sector.

15. A method of iteratively decoding data transferred through a channel, the method comprising:
iteratively decoding a current sector of 1 to N sectors of data;
upon determination of successful completion of iterative decoding of the current sector of the N sectors before a predetermined decoding time, increasing a maximum decoding time for a next sector of the N sectors of the data to be iteratively decoded; and
initiating iterative decoding the next sector of the N sectors.

16. The method as claimed in claim 15, wherein:
initiating the iterative decoding includes immediately initiating decoding of the next sector of the N sectors such that there is no idle time between completion of iterative decoding of the current sector and start of iterative decoding of the next sector, and
the maximum decoding time of the next sector of the N sectors is increased by a time difference between the predetermined decoding time allocated to the current sector one of the N sectors and an actual decoding time of the current sector.

* * * * *